United States Patent
Sung et al.

(10) Patent No.: US 11,342,009 B2
(45) Date of Patent: May 24, 2022

(54) CELL MODULE EQUALIZATION AND PRECHARGE DEVICE AND METHOD

(71) Applicant: LG CHEM, LTD., Seoul (KR)

(72) Inventors: Chang Hyun Sung, Daejeon (KR); Sang Hoon Lee, Daejeon (KR); Yean Sik Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 208 days.

(21) Appl. No.: 16/612,285

(22) PCT Filed: Oct. 15, 2018

(86) PCT No.: PCT/KR2018/012106
§ 371 (c)(1),
(2) Date: Nov. 8, 2019

(87) PCT Pub. No.: WO2019/088500
PCT Pub. Date: May 9, 2019

(65) Prior Publication Data
US 2021/0082480 A1    Mar. 18, 2021

(30) Foreign Application Priority Data
Nov. 6, 2017  (KR) ........................ 10-2017-0146828

(51) Int. Cl.
*H02J 7/00* (2006.01)
*G11C 7/12* (2006.01)
*H02M 3/158* (2006.01)

(52) U.S. Cl.
CPC .............. *G11C 7/12* (2013.01); *H02J 7/0016* (2013.01); *H02M 3/158* (2013.01)

(58) Field of Classification Search
CPC ..................................................... H02M 3/158
See application file for complete search history.

(56) References Cited

U.S. PATENT DOCUMENTS

| | | | |
|---|---|---|---|
| 2008/0191663 A1 | 8/2008 | Fowler et al. | |
| 2010/0127663 A1* | 5/2010 | Furukawa | B60L 3/04 320/134 |
| 2011/0140663 A1* | 6/2011 | Tofigh | H02J 7/0019 320/116 |

(Continued)

FOREIGN PATENT DOCUMENTS

| | | |
|---|---|---|
| EP | 2 993 074 A1 | 3/2016 |
| JP | 2006-507790 A | 3/2006 |

(Continued)

OTHER PUBLICATIONS

Extended European Search Report for European Application No. 18873941.1, dated Feb. 10, 2020.
Moore et al., "A Review of Cell Equalization Methods for Lithium Ion and Lithium Polymer Battery Systems," Society of Automotive Engineers, Inc., 2001, XP-002954937, pp. 1-5.

(Continued)

*Primary Examiner* — Daniel Kessie
(74) *Attorney, Agent, or Firm* — Birch, Stewart, Kolasch & Birch, LLP

(57) ABSTRACT

A device and a method for equalizing and precharging a cell module, which may form a circuit for performing a corresponding operation by a converter unit by selectively connecting the converter unit and one or more cell modules by controlling a conduction state of a switching unit based on an operation which the converter intends to perform.

12 Claims, 6 Drawing Sheets

(56) References Cited

U.S. PATENT DOCUMENTS

| | | | |
|---|---|---|---|
| 2012/0293129 A1 | 11/2012 | Naghshtabrizi et al. | |
| 2013/0063091 A1* | 3/2013 | Nishi | H01M 10/441 |
| | | | 320/126 |
| 2013/0320991 A1* | 12/2013 | Kiuchi | G01R 31/382 |
| | | | 324/434 |
| 2014/0117756 A1 | 5/2014 | Takahashi et al. | |
| 2014/0306666 A1 | 10/2014 | Choi et al. | |
| 2015/0200559 A1 | 7/2015 | Im | |
| 2016/0059712 A1* | 3/2016 | Jang | H02J 7/342 |
| | | | 307/10.1 |
| 2016/0241052 A1 | 8/2016 | Yang | |
| 2018/0191172 A1* | 7/2018 | Melin | H01M 10/44 |

FOREIGN PATENT DOCUMENTS

| | | |
|---|---|---|
| JP | 2014-90595 A | 5/2014 |
| JP | 5704063 B2 | 4/2015 |
| JP | 2017-34887 A | 2/2017 |
| KR | 10-2010-0085791 A | 7/2010 |
| KR | 10-2014-0123164 A | 10/2014 |
| KR | 10-2015-0085383 A | 7/2015 |
| KR | 10-2016-0024254 A | 3/2016 |
| KR | 10-2016-0099357 A | 8/2016 |
| WO | WO 2014/156041 A1 | 10/2014 |

OTHER PUBLICATIONS

International Search Report for PCT/KR2018/012106 (PCT/ISA/210) dated Jan. 25, 2019.

* cited by examiner

[Figure 1]
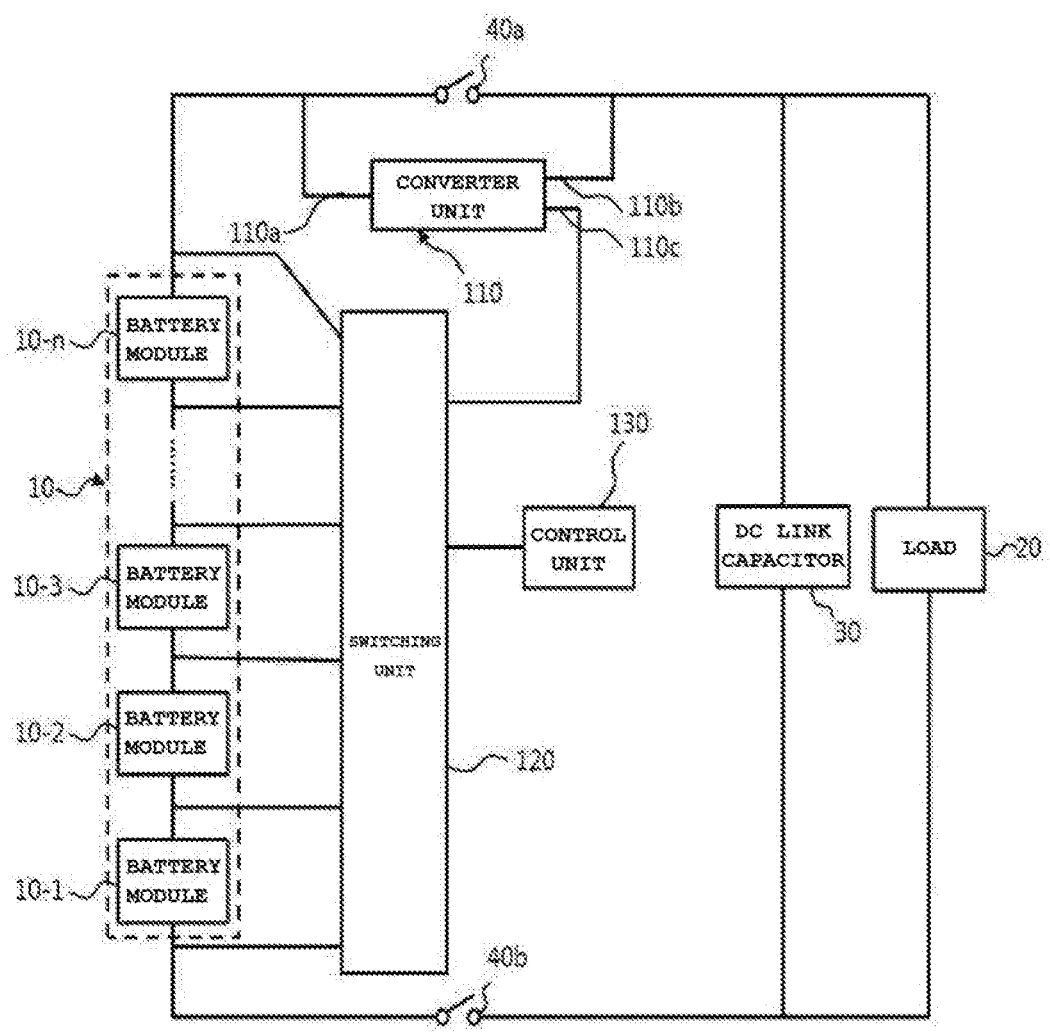

[Figure 2]
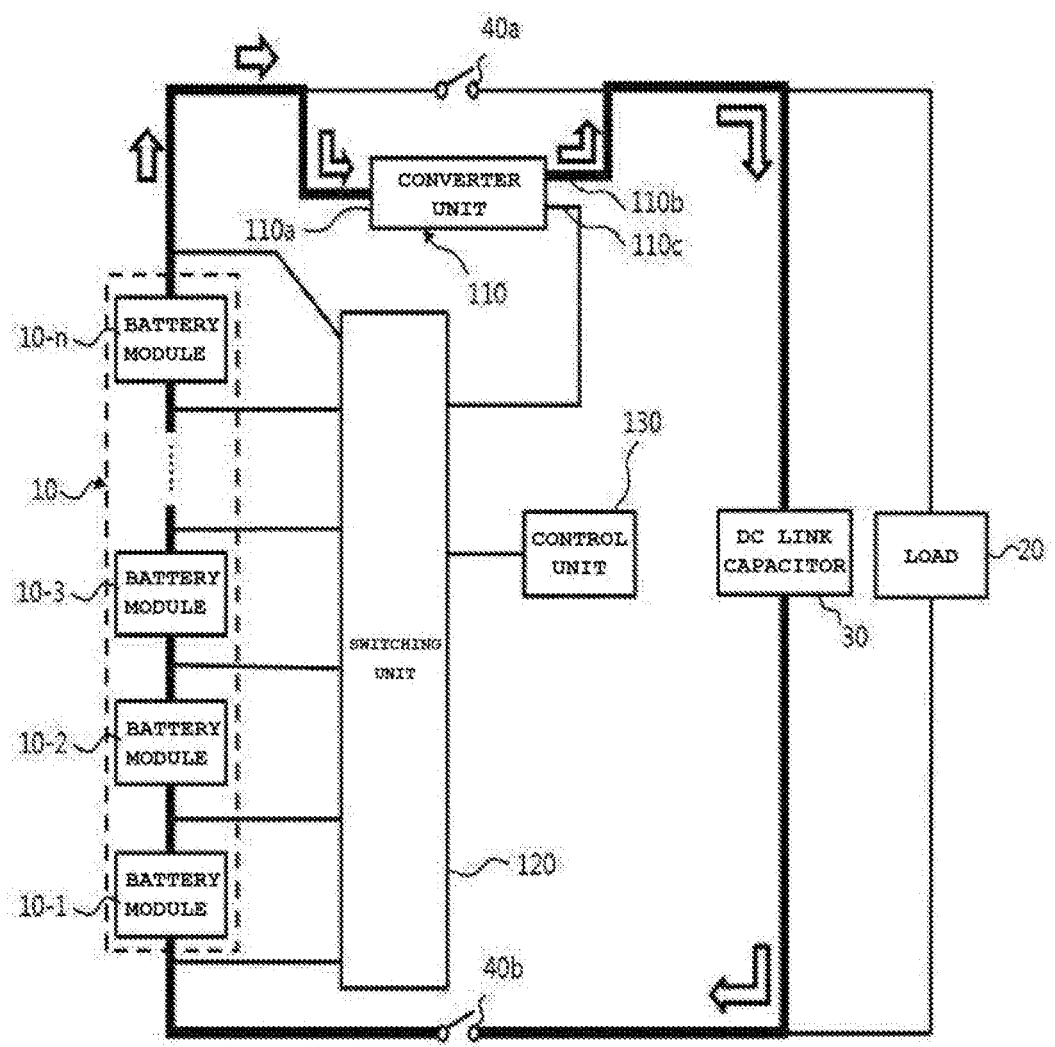

[Figure 3]
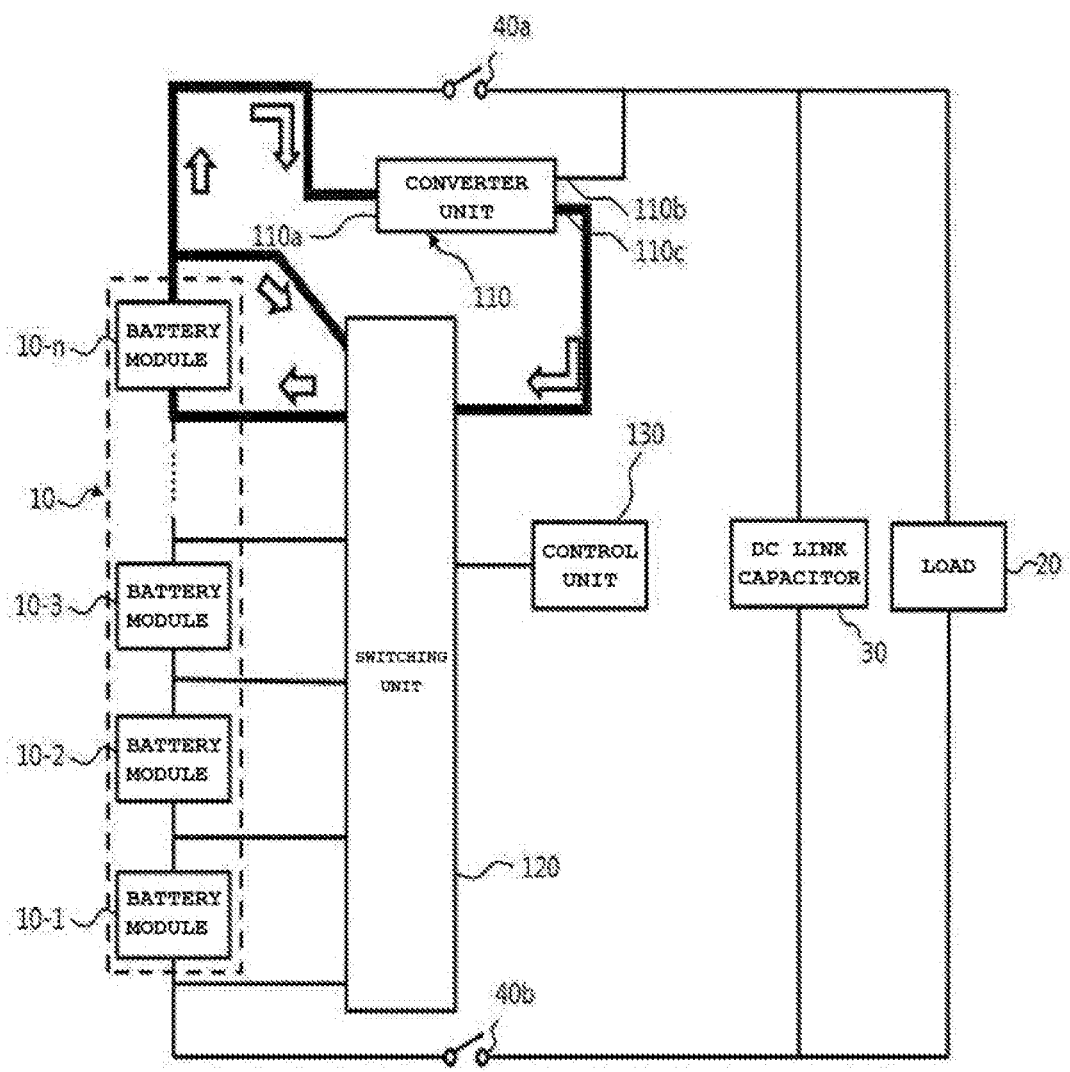

[Figure 4]
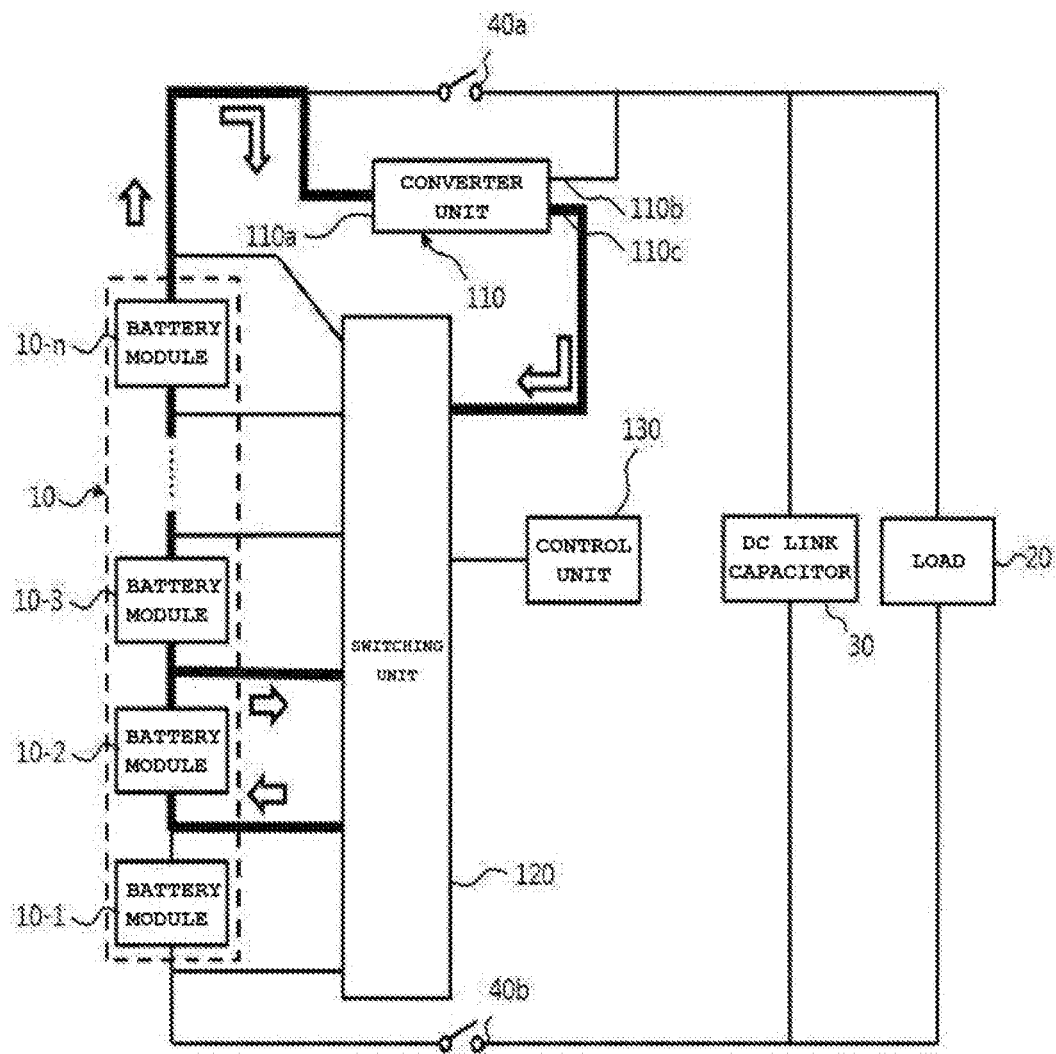

[Figure 5]
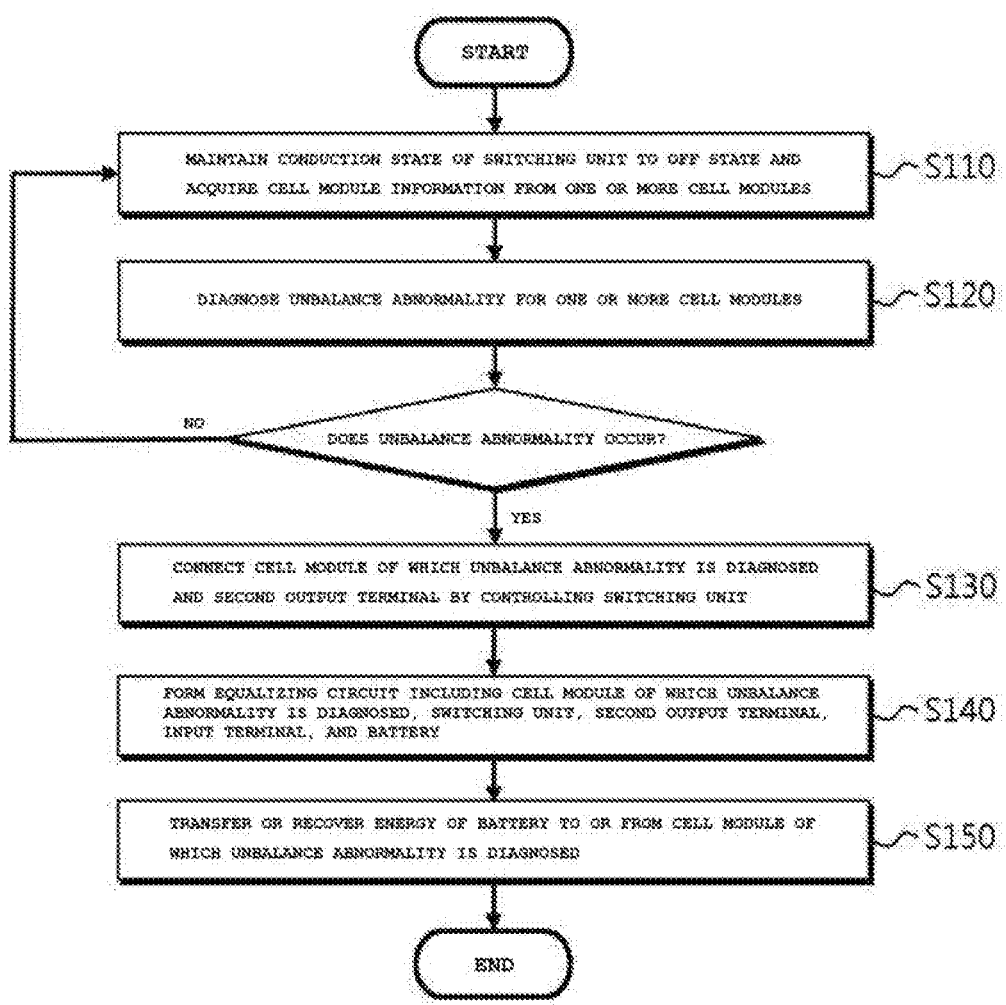

[Figure 6]
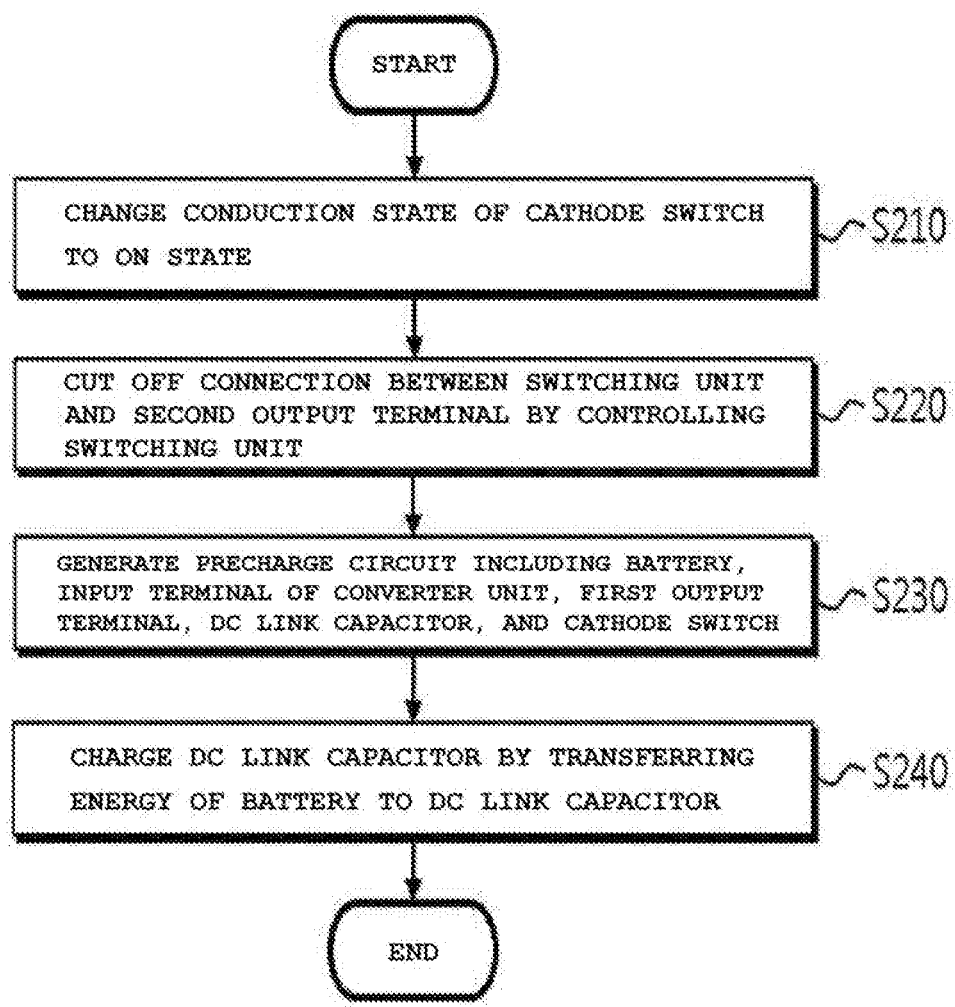

CELL MODULE EQUALIZATION AND PRECHARGE DEVICE AND METHOD

TECHNICAL FIELD

This application claims priority to and the benefit of Korean Patent Application No. 10-2017-0146828 filed in the Korean Intellectual Property Office on Nov. 6, 2017, the entire contents of which are incorporated herein by reference.

The present invention relates to a device and a method for equalizing and precharging a cell module, and more particularly, to a device and a method for equalizing and precharging a cell module, which may form a circuit for performing a corresponding operation by a converter unit by selectively connecting the converter unit and one or more cell modules by controlling a conduction state of a switching unit based on an operation which the converter intends to perform.

BACKGROUND ART

In general, in a secondary battery, in environments requiring a high capacity, such as an electric vehicle, an energy storage system, and an interruptible power supply, one battery module can be used by connecting a plurality of unit secondary battery cells and in some cases, a plurality of battery modules may be connected and used.

When a plurality of battery modules is together used, voltages of the plurality of battery modules may be unbalanced due to various factors including production deviation occurring while producing the battery module, a temperature deviation of the battery module, and the like.

Meanwhile, when battery modules in which voltage is unbalanced are combined and used, available capacities and powers of the plurality of battery modules are reduced and aging of the battery module is accelerated, thereby shortening a lifespan of the battery module. In order to solve such a problem, an inter-module unbalance is diagnosed based on various state information such as voltage, current, and temperatures of respective individual modules when the plurality of battery modules is connected and used, and as a result, a deviation between the battery modules needs to be removed through a balancing operation.

In addition, in a battery management system in the related art, various systems such as a system for measuring, monitoring, and diagnosing a state of a battery as well as balancing the battery are constructed in a complex manner, thereby increasing cost for configuring the system or a volume of the system.

Therefore, in order to solve a problem of the battery management system in the related art, the present inventor has developed a device and a method for equalizing and precharging a cell module, which allow a converter unit to perform various functions by controlling one switching unit by selectively connecting the converter unit and one or more cell modules by controlling a conduction state of the switching unit based on an operation which the converter unit intends to perform.

DETAILED DESCRIPTION OF THE INVENTION

Technical Problem

The present invention is contrived to solve the aforementioned problem and the present invention provides a device and a method for equalizing and precharging a cell module, which may form a circuit for performing a corresponding operation by a converter unit by selectively connecting the converter unit and one or more cell modules by controlling a conduction state of a switching unit based on an operation which the converter intends to perform.

Technical Solution

A cell module equalizing and precharging device according to an embodiment of the present invention may include: a converter unit located between a battery including one or more cell modules and a load, the converter unit performing a precharging operation and an equalizing operation; a switching unit connecting each of the one or more cell modules and the converter unit; and a control unit selectively forming a precharge circuit for performing the precharging operation or an equalizing circuit for performing the equalizing operation by controlling a conduction state of the switching unit based on an operation which the converter unit intends to perform.

In an embodiment, the converter unit may include an input terminal connected with the battery, a first output terminal connected with the load, and a second output terminal connected with the switching unit.

In an embodiment, when the converter unit intends to perform the precharging operation, the control unit may form the precharge circuit including the battery, the input terminal and the first output terminal by controlling the switching unit to cut off a connection between the second output terminal and the switching unit.

In an embodiment, the control unit may acquire cell module information from the one or more cell modules and diagnose unbalance abnormality of the one or more cell modules based on the cell module information.

In an embodiment, when the converter unit intends to perform the equalizing operation, the control unit may form the equalizing circuit including the one or more cell modules of which unbalance abnormality is diagnosed, the input terminal, and the second output terminal by controlling the switching unit to connect the one or more cell modules of which unbalance abnormality is diagnosed and the second output terminal.

In an embodiment, when recovery of energy from the one or more cell modules of which unbalance abnormality is diagnosed is required, the control unit may control an operation of the converter unit so as to transfer the energy of the one or more cell modules of which unbalance abnormality is diagnosed from the second output terminal to the input terminal.

In an embodiment, when transfer of the energy to the one or more cell modules of which unbalance abnormality is diagnosed is required, the control unit may control an operation of the converter unit so as to transfer the energy output from the battery from the input terminal to the second output terminal.

A cell module equalizing and precharging method according to an embodiment of the present invention may include: performing, by a converter unit located between a battery including one or more cell modules and a load, a precharging operation and an equalizing operation; connecting, by a switching unit, each of the one or more cell modules and the converter unit; and controlling a conduction state of the switching unit in order to selectively form a precharge circuit for performing the precharging operation or an equalizing circuit for performing the equalizing operation based on an operation which the converter unit intends to perform.

In an embodiment, the converter unit may include an input terminal connected with the battery, a first output terminal connected with the load, and a second output terminal connected with the switching unit.

In an embodiment, the controlling may include, when the converter unit intends to perform the precharging operation, forming the precharge circuit including the battery, the input terminal and the first output terminal by controlling the switching unit to cut off a connection between the second output terminal and the switching unit.

In an embodiment, the controlling may include acquiring cell module information from the one or more cell modules and diagnosing unbalance abnormality of the one or more cell modules based on the cell module information.

In an embodiment, the controlling may further include, when the converter unit intends to perform the equalizing operation, forming the equalizing circuit including the one or more cell modules of which unbalance abnormality is diagnosed, the input terminal, and the second output terminal by controlling the switching unit to connect the one or more cell modules of which unbalance abnormality is diagnosed and the second output terminal.

In an embodiment, when recovery of energy from the one or more cell modules of which unbalance abnormality is diagnosed is required, the method further includes controlling an operation of the converter unit so as to transfer the energy of the one or more cell modules of which unbalance abnormality is diagnosed from the second output terminal to the input terminal.

In an embodiment, when transfer of the energy to the one or more cell modules of which unbalance abnormality is diagnosed is required, the method further includes controlling an operation of the converter unit so as to transfer the energy output from the battery from the input terminal to the second output terminal.

Advantageous Effects

According to the present invention, a precharge circuit for a precharging operation or an equalization circuit for an equalization operation may be selectively formed by selectively connecting a converter unit and one or more cell modules by controlling a conduction state of a switching unit based on an operation which the converter intends to perform and various operations are performed by using one converter unit, thereby reducing a volume and a price of a system.

BRIEF DESCRIPTION OF DRAWINGS

FIG. 1 is a diagram schematically illustrating components of a cell module equalizing and precharging device 100 according to an embodiment of the present invention.

FIG. 2 is a diagram schematically illustrating a precharge circuit in the cell module equalizing and precharging device 100 according to an embodiment of the present invention.

FIGS. 3 and 4 are diagrams schematically illustrating an equalizing circuit in the cell module equalizing and precharging device 100 according to an embodiment of the present invention.

FIG. 5 is a flowchart for describing a series of processes of performing an equalizing operation of a cell module by using the cell module equalizing and precharging device 100 according to an embodiment of the present invention.

FIG. 6 is a flowchart for describing a series of processes of performing a precharging operation of the cell module by using the cell module equalizing and precharging device 100 according to an embodiment of the present invention.

BEST MODE

Hereinafter, a preferred embodiment is presented in order to assist understanding of the present invention. However, the following embodiment is just provided to more easily understand the present invention and contents of the present invention are not limited by the embodiment.

FIG. 1 is a diagram schematically illustrating a cell module equalizing and precharging device 100 according to an embodiment of the present invention.

Referring to FIG. 1, the cell module equalizing and precharging device 100 according to an embodiment of the present invention may be configured to include a converter unit 110, a switching unit 120, and a control unit 130.

Here, the device 100 for equalizing and precharging a cell module illustrated in FIG. 1 follows an embodiment and it should be noted that components thereof are not limited to the embodiment illustrated in FIG. 1 and as necessary, the components may be replaced, added, modified, or deleted.

First, the converter unit 110 may be located between a battery 10 including one or more of cell modules 10-1 to 10-$n$ and a load 20 and may perform a precharging operation or an equalizing operation. For example, when one or more cell modules 10-1 to 10-$n$ are connected in series, the converter unit 110 may be located between the cell module 10-$n$ located at a forefront end and the load 20. Further, the converter unit 110 may be connected with an anode switch 40a in parallel.

Here, the precharging operation may mean an operation of equalizing voltage of a DC link capacitor 30 to voltage of the battery 10 by charging the DC link capacitor 30 with the voltage of the battery 10 by charging a DC link capacitor 30 before operating main switches 40a and 40b in order to prevent fusion of the main switches 40a and 40b.

Here, the equalizing operation may mean an operation performed to equalize energy possessed by one or more cell modules 10-1 to 10-$n$. For example, the equalizing operation may be an operation of supplying the energy to a cell module which is insufficient in energy compared to other cell modules among one or more cell modules 10-1 to 10-$n$ and an operation of recovering the energy from a cell module which is excessive in energy compared to other cell modules.

In an embodiment, the converter unit 110 may receive power from the battery 10 and transfer the received power to the DC link capacitor 30 or the cell modules 10-1 to 10-$n$ having abnormality. To this end, the converter unit 110 may include an input terminal 110a connected to the battery 10 and receiving the power from the battery 10, a first output terminal 110b connected to the load 20 side and supplying the energy to the DC link capacitor 30, and a second output terminal 110c connected with a switching unit to be described below and supplying the power to the cell modules 10-1 to 10-$n$. As an example, the converter unit 110 may be a multiple output insulated bidirectional converter which may output one input value into a plurality of output values.

The multi output insulated bidirectional converter may be constituted by one input terminal and two output terminals and since the input terminal and the output terminal are insulated from each other to bidirectionally transfer the energy. Therefore, the energy supplied from the battery 10 may be provided to the cell modules 10-1 to 10-$n$ which has relatively insufficient energy compared to other cell modules 10-1 to 10-$n$ and the energy may be recovered from the cell modules 10-1 to 10-$n$ which is excessive in energy.

The switching unit 120 may connect each of one or more cell modules 10-1 to 10-$n$ and the converter unit 110. For example, as illustrated in FIG. 1, one side of the switching unit 120 may be connected with an anode terminal and a cathode terminal of each of one or more cell modules 10-1 to 10-$n$ and the other side is connected with a second output terminal 110$c$ of the converter unit 110 to connect each of one or more cell modules 10-1 to 10-$n$ and the converter unit 110.

In an embodiment, the switching unit 120 may be a switch matrix and selectively connects the anode terminal and the cathode terminal of the cell modules 10-1 to 10-$n$ selected through the control unit 130 to be described below to connect one or more cell modules 10-1 to 10-$n$ and the converter unit 110.

In an embodiment, when the operation of the cell module equalizing and precharging device 100 according to an embodiment of the present invention starts and when an unbalance abnormality of one or more cell modules 10-1 to 10-$n$ is not diagnosed, the switching unit 120 maintains an off state to cut off connection between one or more cell modules 10-1 to 10-$n$ and the connector unit 110.

The control unit 130 may selectively form a precharge circuit for performing the precharging operation or an equalizing circuit for performing the equalizing operation by controlling the conduction state of the switching unit 120 based on the operation which the converter unit 110 intends to perform. Hereinafter, with reference to FIGS. 2 to 4, a configuration in which the control unit 130 forms the precharge circuit and the equalizing circuit will be described in detail.

FIG. 2 is a diagram schematically illustrating a precharge circuit in the cell module equalizing and precharging device 100 according to an embodiment of the present invention and FIGS. 3 and 4 are diagrams schematically illustrating an equalizing circuit in the cell module equalizing and precharging device 100 according to an embodiment of the present invention.

First, referring to FIG. 2, the control unit 130 may form the precharge circuit by controlling the switching unit 120 when the converter unit 110 intends to perform the precharging operation. For example, when the converter unit 110 intends to perform the precharging operation, the control unit 130 changes the conduction state of the cathode switch 40$b$ of the main switches 40$a$ and 40$b$ to an on state and controls the conduction state of the switching unit 120 to cut off the connection between the second output terminal 110$c$ and the switching unit 120. Therefore, the control unit 130 may form the precharge circuit which is a closed circuit including the battery 10, the input terminal 110$a$, the first output terminal 110$b$, the DC link capacitor 30, and the cathode switch 40$b$. Here, the power applied from the battery 10 may be applied to the DC link capacitor 30 through the first output terminal 110$b$ of the converter unit 110 and the DC link capacitor 30 may be charged by using the applied power of the battery 10. Thereafter, when the voltage charged in the DC link capacitor 30 becomes equal to the voltage of the battery 10, the control unit 130 changes the conduction state of the cathode switch 40$b$ to an off state to short the precharge circuit, thereby stopping the precharging operation of the converter unit 110.

Next, referring to FIG. 3, the control unit 130 may form the equalizing circuit by controlling the switching unit 120 when the converter unit 110 intends to perform the equalizing operation. For example, the control unit 130 may acquire cell module information from one or more cell modules 10-1 to 10-$n$ and diagnose the unbalance abnormality of one or more cell modules 10-1 to 10-$n$ based on the acquired cell module information.

Here, the cell module information may mean information indicating states of one or more cell modules 10-1 to 10-$n$. For example, the cell module information may include at least any one of current, voltage, a temperature, a remaining capacity (SOC), and a remaining lifespan (SOH).

The control unit 130 may diagnose the unbalance abnormality of one or more cell modules 10-1 to 10-$n$ based on the cell module information. Here, when the unbalance abnormality is diagnosed in an n-th cell module 10-$n$ as in FIG. 3, the control unit 130 may connect the anode terminal and the cathode terminal of the n-th cell module 10-$n$ and the second output terminal 110$c$ of the converter unit 110 by controlling the switching unit 120. Therefore, the control unit 130 may form the equalizing circuit which is the closed circuit including the n-th cell module 10-$n$, the switching unit 120, the second output terminal 110$c$ of the converter unit 110, and the input terminal 110$a$ of the converter unit 110.

Next, referring to FIG. 4, the control unit 130 may form the equalizing circuit by a method which is the same as the method. For example, when the unbalance abnormality occurs in a second cell module 10-2, the control unit 130 may connect the anode terminal and the cathode terminal of the second cell module 10-2 and the second output terminal 110$c$ of the converter unit 110 by controlling the switching unit 120. Therefore, the control unit 130 may form the equalizing circuit which is the closed circuit including the second cell module 10-2, the switching unit 120, the second output terminal 110$c$ of the converter unit 110, and the input terminal 110$a$ of the converter unit 110.

In an embodiment, when the energy needs to be transferred to the cell modules 10-1 to 10-$n$ of which balance abnormality is diagnosed, the control unit 130 may control the operation of the converter unit 110 so that the energy output from the battery 10 is transferred from the input terminal 110$a$ to the second output terminal 110$c$. For example, referring to FIG. 3, when the energy of the n-th cell module 10-$n$ is insufficient compared to the energy of other cell modules 10-1 to 10-3, the control unit 130 transfers the energy of the battery 10 input into the input terminal 110$a$ to the second output terminal 110$c$ by controlling the operation of the converter unit 110 and provides the energy of the battery 10 transferred to the second output terminal 110$c$ to the n-th cell module 10-$n$ to charge the n-th cell module 10-$n$ with the insufficient energy, thereby solving the unbalance abnormality.

In an embodiment, when recovery of the energy is required from one or more cell modules 10-1 to 10-$n$ of which balance abnormality is diagnosed, the control unit 130 may control the operation of the converter unit 110 so that the energy of one or more cell modules 10-1 to 10-$n$ of which unbalance abnormality is diagnosed is transferred from the second output terminal 110$c$ to the input terminal 110$a$. For example, referring to FIG. 4, when the energy of the second cell module 10-2 is more than the energy of other cell modules 10-1, and 10-3 to 10-$n$, the control unit 130 transfers the energy of the second cell module 10-2 to the second output terminal 110$c$ by controlling the operation of the converter unit 110 and transfers the transferred energy of the second cell module 10-2 to the battery 10 through the input terminal 110$a$ to consume excessive energy of the second cell module 10-2, thereby solving the unbalance abnormality. Hereinafter, referring to FIGS. 5 and 6, a cell module equalizing and precharging method according to an embodiment of the present invention will be described.

FIG. 5 is a flowchart for describing a series of processes of performing an equalizing operation of a cell module by using the cell module equalizing and precharging device 100 according to an embodiment of the present invention and FIG. 6 is a flowchart for describing a series of processes of performing a precharging operation of the cell module by using the cell module equalizing and precharging device 100 according to an embodiment of the present invention.

First, referring to FIG. 5, the conduction state of the switching unit is maintained to the off state and the cell module information is acquired from one or more cell modules (S110). An unbalance is diagnosed with respect to one or more cell modules based on the cell module information acquired in step S110 (S120). In this case, when there is no unbalance abnormality, the unbalance abnormality of one or more cell modules is continuously monitored by returning to step S110. However, when the unbalance abnormality occurs, the cell module of which unbalance abnormality is diagnosed and the second output terminal are connected by controlling the switching unit and an equalizing circuit including the cell module of which unbalance abnormality is diagnosed, the switching unit, the second output terminal, the input terminal, and the battery is formed through the connection. The energy is transferred to or recovered from the cell module of which unbalance abnormality is diagnosed by using the equalizing circuit formed in steps S130 and S140 (S150).

Next, referring to FIG. 6, when the precharging operation is intended to be performed, the conduction state of the cathode switch is changed to the on state (S210). Thereafter, the connection between the switching unit and the second output terminal is cut off by controlling the switching unit and a precharge circuit is generated, which includes the battery, the input terminal of the converter unit, the first output terminal, the DC link capacitor, and the cathode switch (S220 and S230). The energy of the battery is transferred to the DC link capacitor by performing the precharging operation through the precharge circuit formed in steps S220 and S230 to charge the DC link capacitor (S240).

The aforementioned cell module equalizing and precharging method is described with reference to the flowcharts presented in the drawings. The method has been shown and described by a series of blocks for easy description, but it is to be understood that the present invention is not limited to the order of the blocks, and that some blocks may be generated in different orders from and concurrently with other blocks as shown and described in the present specification, and various other branches, flow paths, and orders of blocks may be implemented to achieve the same or similar result. In addition, all illustrated blocks may not be required for the implementation of the method described in the present specification.

The present invention has been described with reference to the preferred embodiments, but those skilled in the art will understand that the present invention can be variously modified and changed without departing from the spirit and the scope of the present invention which are defined in the appended claims.

The invention claimed is:

1. A cell module equalizing and precharging device comprising:
a converter unit located between a battery including one or more cell modules and a load, the converter unit performing a precharging operation and an equalizing operation;
a switching unit connecting each of the one or more cell modules and the converter unit; and
a control unit selectively forming a precharge circuit for performing the precharging operation or an equalizing circuit for performing the equalizing operation by controlling a conduction state of the switching unit based on an operation which the converter unit intends to perform,
wherein the precharging operation includes charging a DC link capacitor with the battery to equalize a voltage of the DC link capacitor to a voltage of the battery,
wherein the DC link capacitor is located between the load and the battery,
wherein the converter unit includes:
an input terminal connected with the battery;
a first output terminal connected with the load; and
a second output terminal connected with the switching unit, and
wherein the control unit controls the switching unit to connect the one or more cell modules and the second output terminal to form the equalizing circuit.

2. The cell module equalizing and precharging device of claim 1, wherein the control unit forms the precharge circuit including the battery, the input terminal and the first output terminal by controlling the switching unit to cut off a connection between the second output terminal and the switching unit.

3. The cell module equalizing and precharging device of claim 1, wherein the control unit acquires cell module information from the one or more cell modules and diagnoses unbalance abnormality of the one or more cell modules based on the cell module information.

4. The cell module equalizing and precharging device of claim 3, wherein the control unit forms the equalizing circuit including the one or more cell modules of which unbalance abnormality is diagnosed, the input terminal, and the second output terminal by controlling the switching unit to connect the one or more cell modules of which unbalance abnormality is diagnosed and the second output terminal.

5. The cell module equalizing and precharging device of claim 4, wherein when recovery of energy from the one or more cell modules of which unbalance abnormality is diagnosed is required, the control unit controls an operation of the converter unit so as to transfer the energy of the one or more cell modules of which unbalance abnormality is diagnosed from the second output terminal to the input terminal.

6. The cell module equalizing and precharging device of claim 4, wherein when transfer of energy to the one or more cell modules of which unbalance abnormality is diagnosed is required, the control unit controls an operation of the converter unit so as to transfer the energy output from the battery from the input terminal to the second output terminal.

7. A cell module equalizing and precharging method comprising:
performing, by a converter unit located between a battery including one or more cell modules and a load, a precharging operation and an equalizing operation;
connecting, by a switching unit, each of the one or more cell modules and the converter unit; and
controlling a conduction state of the switching unit in order to selectively form a precharge circuit for performing the precharging operation or an equalizing circuit for performing the equalizing operation based on an operation which the converter unit intends to perform, wherein the precharging operation includes charging a DC link capacitor with the battery to equalize a voltage of the DC link capacitor to a voltage of the battery, wherein the DC link capacitor is located between the load and the battery, wherein the converter unit includes:

an input terminal connected with the battery;

a first output terminal connected with the load; and a second output terminal connected with the switching unit, and wherein the control unit controls the switching unit to connect the one or more cell modules and the second output terminal to form the equalizing circuit.

8. The cell module equalizing and precharging method of claim 7, wherein the controlling includes forming the precharge circuit including the battery, the input terminal and the first output terminal by controlling the switching unit to cut off a connection between the second output terminal and the switching unit by controlling the switching unit.

9. The cell module equalizing and precharging method of claim 7, wherein the controlling includes acquiring cell module information from the one or more cell modules and diagnosing unbalance abnormality of the one or more cell modules based on the cell module information.

10. The cell module equalizing and precharging method of claim 9, wherein the controlling further includes, forming the equalizing circuit including the one or more cell modules of which unbalance abnormality is diagnosed, the input terminal, and the second output terminal by controlling the switching unit to connect the one or more cell modules of which unbalance abnormality is diagnosed and the second output terminal.

11. The cell module equalizing and precharging method of claim 10, wherein when recovery of energy from the one or more cell modules of which unbalance abnormality is diagnosed is required, the method further includes controlling an operation of the converter unit so as to transfer the energy of the one or more cell modules of which unbalance abnormality is diagnosed from the second output terminal to the input terminal.

12. The cell module equalizing and precharging method of claim 10, wherein when transfer of the energy to the one or more cell modules of which unbalance abnormality is diagnosed is required, the method further includes controlling an operation of the converter unit so as to transfer the energy output from the battery from the input terminal to the second output terminal.

* * * * *